United States Patent [19]
Lee et al.

[11] Patent Number: 6,025,745
[45] Date of Patent: Feb. 15, 2000

[54] AUTO-CALIBRATING DIGITAL DELAY CIRCUIT

[75] Inventors: Fee Lee, Framingham; Keith Childs, Whitinsville, both of Mass.

[73] Assignee: Digital Equipment Corporation, Houston, Tex.

[21] Appl. No.: 08/881,436

[22] Filed: Jun. 24, 1997

[51] Int. Cl.[7] ....................................... H03K 5/13
[52] U.S. Cl. ........................... 327/277; 327/262; 327/278
[58] Field of Search ........................... 327/262, 269–272, 327/276–278, 284, 285, 258, 99, 407

[56] References Cited

U.S. PATENT DOCUMENTS

| | | | |
|---|---|---|---|
| 5,087,842 | 2/1992 | Pulsipher et al. | 327/270 |
| 5,245,231 | 9/1993 | Kocis et al. | 327/277 |
| 5,428,309 | 6/1995 | Yamauchi et al. | 327/277 |
| 5,475,690 | 12/1995 | Burns et al. | 327/271 |
| 5,731,726 | 3/1998 | Farwell et al. | 327/277 |

*Primary Examiner*—Timothy P. Callahan
*Assistant Examiner*—Eunja Shin
*Attorney, Agent, or Firm*—Williams, Morgan & Amerson

[57] ABSTRACT

A delay circuit comprises a tapped delay element line constructed from delay elements with fixed delay intervals and a multiplexer for selecting the signal at one of the taps to produce a variable delay through the circuit. The multiplexer is controlled by a selection circuit which receives an input indicative of the actual delay time through the delay circuit from an oscillator constructed from the same fixed delay elements as the delay line.

15 Claims, 3 Drawing Sheets

AUTO-CALIBRATING DIGITAL DELAY CIRCUIT

FIELD OF THE INVENTION

This invention relates generally to circuits for delaying an electronic signal and, more particularly, to digital delay circuits that automatically recalibrate themselves to produce more consistent delay times.

BACKGROUND OF THE INVENTION

A typical delay circuit receives an input signal and generates a replica of the input signal after a predetermined time has elapsed. Delay circuits are commonly used in applications which require synchronization between two electronic signals or which require temporary storage of a signal for a fixed period of time.

For example, delay circuits may be used to resynchronize signals traveling on the parallel wires of a bus, such as a Small Computer Standard Interface, or SCSI, bus. Such a bus comprises a plurality of parallel data wires and a single clock wire. Due to switching transients in the bus drivers and other circuitry, data signals on the plurality of data wires are stable during certain time intervals and unstable during other time intervals. It is important that devices connected to the bus read the data lines only during the time intervals during which the data signals are stable. Consequently, a signal on the clock wire is used to control the time period during which devices connected to the bus read data from the data lines.

The conventional SCSI bus arrangement works well, but limits the physical length of a SCSI bus. The data and clock signals propagate down the bus lines at slightly different speeds due to a variety of factors, and, as the bus gets longer, the differences in propagation speeds cause the data signals to arrive at a given point at different times, a phenomenon called "skew." If the skew becomes large enough, it may shift the arrival of a data signal relative to the clock signal at a peripheral device by an amount sufficient to cause the data signal to be read in its unstable region, thereby causing a data error.

One prior art solution to this problem is to use a "store and forward" buffer system. In this arrangement, signals on the bus are received and stored until signals are received for each bus line. When all signals have been received, the signals are simultaneously retransmitted on another SCSI bus, thereby overcoming the skew problem. However, SCSI busses have a number of timing requirements which restrict the use of the buffering approach. For example, in accordance with conventional operation, a host computer transmits a signal to a peripheral device which then sends a signal back to the host. The host waits a predetermined amount of time to receive the response from the device. If a response is not received from the device in the predetermined amount of time, the message is considered as not received. This operation prevents any open-ended communications between a host and a peripheral device.

A certain amount of time is required for a signal to propagate from a host computer to the peripheral device. Accordingly, if an extremely long cable is used, the propagation time may be longer than the predetermined time that the host is going to wait. The prior art method of storing signals in a buffer exacerbates this problem and, if buffering is used, the SCSI bus cables must be physically shortened to accommodate the time lost while the information is stored in a buffer. In addition to the skew problem, the prior art buffering method is not effective for high-speed lines since it slows down transmission between two SCSI busses.

Another prior art method for overcoming the skewing problem is to introduce a delay circuit into each bus line at a remote position along the SCSI bus after the clock and data signals have traveled through the bus. The delay circuits realign the signals to eliminate skew. One type of delay circuit utilized for this purpose is constructed from discrete circuit elements. This type of delay circuit does not provide consistent delay times because the delay times through the discrete elements can vary significantly with fluctuating operating conditions, such as temperature and voltage. Different variables in the manufacturing processes used to manufacture the discrete elements can also create variances from unit to unit. To overcome the latter problems, some circuits are manufactured by laser trimming some of the components after the circuit is assembled on a circuit-by-circuit basis in order to provide more accurate propagation delays. This is not economically desirable, however, because of the extra cost associated with the laser trimming process.

Other prior art circuits use tunable delay circuits. These latter circuits monitor the actual delay times and adjust themselves to provide more consistent, non-varying delay times. For example, U.S. Pat. No. 5,087,842 (Pulsipher et al.), discloses a self-adjusting delay circuit that includes a set of voltage controlled delay elements in each bus line. A ring oscillator is constructed with the same voltage controlled delay element used in the bus lines. The output of the ring oscillator which is indicative of the actual delay time through each of the delay elements is provided to an external microprocessor that adjusts all of the delay elements including that in the ring oscillator until the delay as measured by the ring oscillator meets a predetermined value. This type of delay circuit is not commercially optimal, however, because it requires adjustable delays which, in turn, require complex circuitry and an the external microprocessor, which also increases the size and manufacturing cost of the circuit.

Accordingly, It is among the general objects of the invention to provide a delay device that produces a substantially constant delay time.

It is also another object of the invention to provide such a delay device that is inexpensive to produce and implement.

SUMMARY OF THE INVENTION

In accordance with the principles of the invention, a delay circuit comprises a tapped delay element line and a multiplexer for selecting the signal at one of the taps to produce a variable delay through the circuit. The multiplexer is controlled by a selection circuit which receives an input indicative of the actual delay time through the delay circuit from an oscillator constructed from the same fixed delay elements as the delay line.

In accordance with one embodiment of the invention, the selection circuit includes a counter to count pulses produced by the oscillator, and a computation circuit for calculating the appropriate tap to select with the multiplexer. The selection circuit periodically recalibrates the delay circuit to account for any variations.

In accordance with yet another embodiment of the invention, the entire delay circuit, including the selection circuit, is formed from fixed delay elements on a single integrated circuit chip so that each of the delay elements, including those used to construct the oscillator, reacts substantially identically to varying operating conditions, such as voltage and temperature.

BRIEF DESCRIPTION OF THE DRAWINGS

The foregoing and other objects and advantages of the invention will be appreciated more fully from the following further description thereof with reference to the accompanying drawings wherein.

DETAILED DESCRIPTION OF THE ILLUSTRATIVE EMBODIMENT

Figure 1:
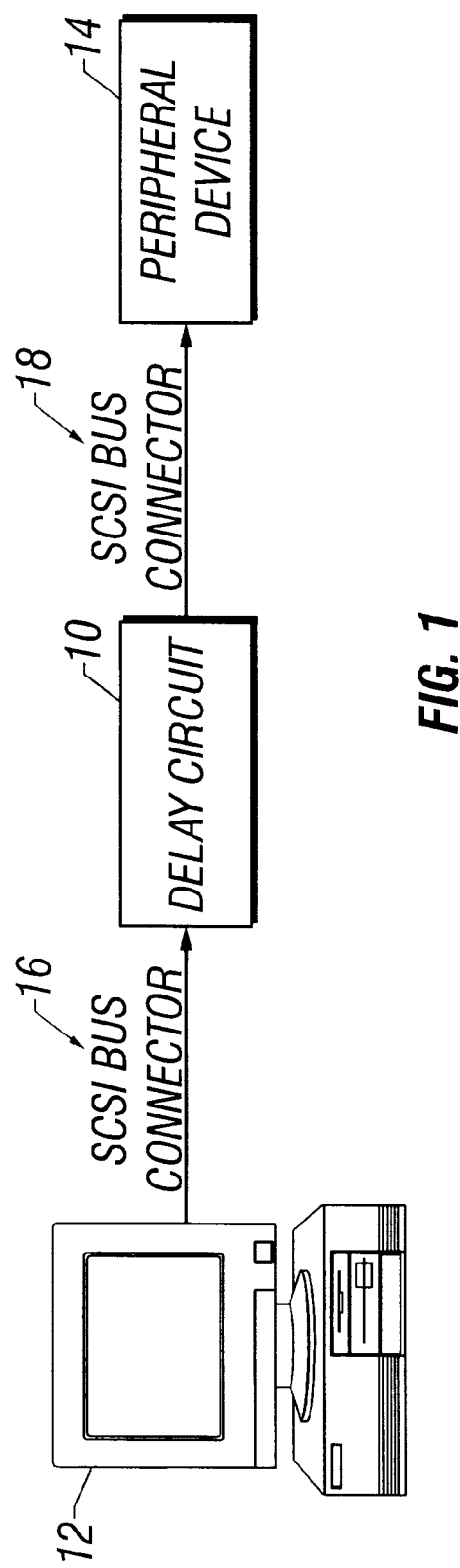
FIG. 1 is a block diagram showing the delay circuit connected between two transmission mediums.

FIG. 1 shows an exemplary use of a digital delay circuit 10 (manufactured in accordance with the invention) between a computer 12 and an external peripheral device 14. A conventional SCSI bus connector 16 can be used to connect peripheral device 14 to computer 12. However, due to the signal skew problems discussed above, the physical length of the SCSI bus is limited to approximately twenty feet. If the peripheral device must be located beyond the normal limit of the conventional SCSI bus, two SCSI bus connectors can be connected in series with the inventive delay circuit. As previously mentioned, the delay circuit realigns the signals to eliminate the skewing problems, thus avoiding data errors. The second SCSI bus connector 18 can then be used to serially connect the delay circuit 10 to the peripheral device 14.

A clock signal transmitted from the computer 12 to the peripheral device 14 will be delayed a preselected time by the delay circuit 10. This preselected time is selected to coordinate the clock signal with a corresponding data signal, thus minimizing the likelihood of timing errors that may occur due to propagation delays through the SCSI bus connectors 16 and 18.

Figure 2:
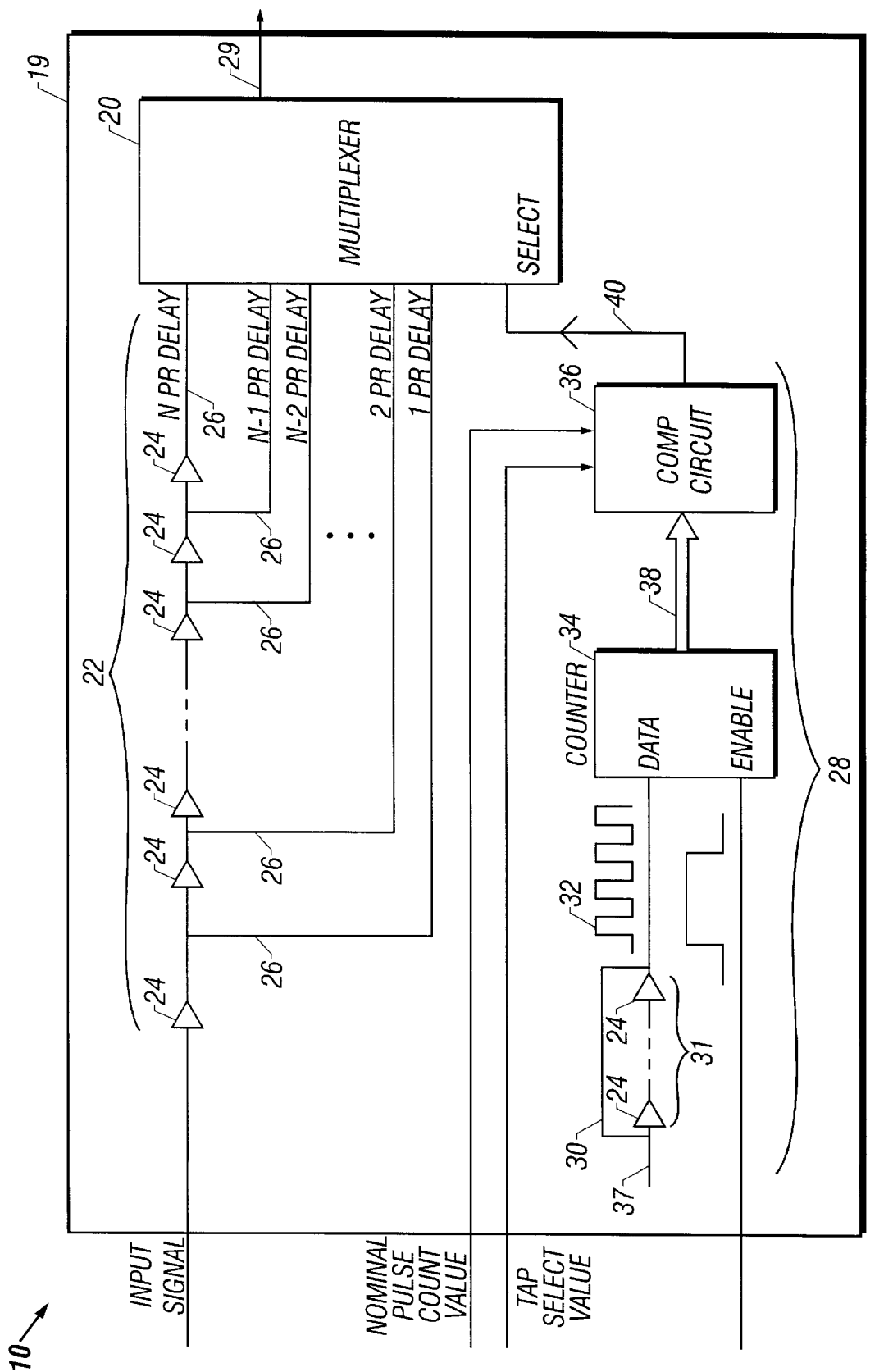
FIG. 2 is a schematic illustration of the delay circuit.

As shown in FIG. 2, the inventive delay circuit 10 is entirely formed on a single integrated circuit chip 19. The delay circuit 10 includes a multiplexer 20, a delay line 22 having a series of serially-connected fixed delay elements 24, a series of circuit taps 26 connected between preselected delay elements 24 and the multiplexer 20, and a selection circuit 28 to select one of the circuit taps 26 for transmitting the signal thereon to a multiplexer output port 29. The input signal is delayed only by the fixed time delays of the delay elements 24 preceding the selected circuit tap 26.

The taps 26 are connected to the multiplexer 20 in an order ranging from a shortest delay to a longest delay. The delay line 22 is designed so that when a nominal delay tap corresponding to the "center" of the multiplexer is selected, the delay line has a nominal delay equal to the desired delay value for the circuit. Then, by selecting taps either before, or after, the nominal delay tap, the delay through the circuit can be varied to bring the actual circuit delay into conformance with the nominal delay. The center of the multiplexer can be chosen by an external signal as will be discussed below. Since varying operating conditions can affect delay time through the delay circuit 10, the selection circuit 28 periodically recalibrates the delay circuit 10 by selecting a new circuit tap 26, thus ensuring that the actual delay time through the delay circuit 10 does not vary from the nominal delay by more than a preselected time tolerance.

The delay elements 24 in the delay line 22 each have a fixed nominal delay time which may vary due to temperature effects, etc. For example, the delay elements 24 may be pairs of inverters, where each pair has a nominal delay time of one nanosecond. The circuit taps 26 may be selectively connected between different combinations of delay elements 24 to provide more or less delay accuracy. For example, eight circuit taps 26 can be connected to a thirty-two pair delay line 22 between every fourth delay element. This would provide a delay accuracy of plus or minus four nanoseconds for a delay line 22 having delay pair elements 24 with one nanosecond delay times. More circuit taps 26 could be added if four nanoseconds is not a sufficient delay accuracy. In such a case, sixteen circuit taps 26 can be connected between every other delay element to provide a delay accuracy within two nanoseconds. If two nanoseconds is not sufficient, thirty-two circuit taps 26 can be connected between every delay element to provide a delay accuracy of one nanosecond. In the event that one nanosecond is not a sufficient delay accuracy, different delay elements 24 may be used having shorter nominal delay times.

Proper selection of the appropriate circuit tap 26 is essential to the effective implementation of the delay circuit 10. The selection circuit 28 accomplishes this by periodically measuring the actual delay time through each delay element in the delay line 22 and determining which circuit tap 26 should be selected to produce the required overall delay. To that end, the selection circuit 28 includes a ring oscillator 30 for producing a pulse train 32 representing the actual delay through the delay line 22, a periodically enabled counter 34 for counting the pulses of the pulse train 32 from the ring oscillator 30, and a computation circuit 36 for receiving the pulse count from the counter 34 and, based on the pulse count, calculating which circuit tap 26 will be selected.

The pulse train 32 represents the actual delay time through the delay line 22 because both the delay line 22 and ring oscillator 30 are fabricated from the same delay devices. For example, two delay elements, each consisting of gate pairs, may be used to construct the ring oscillator. Further, the delay elements used to construct the oscillator and the delay line are fabricated on the same integrated circuit chip 19 so that they would be expected to have the same variance with temperature and time.

The counter 34 is gated by any clocking device, such as an external crystal oscillator (not shown), which periodically emits a gating pulse for a preselected time interval. The preselected time interval is selected based on the application which the delay circuit 10 is being used so that a reasonable number of pulses will be counted by counter 34 during the time interval such as, for example, 128 pulses.

The output count of the counter is provided to a computation circuit 36 which also receives an external nominal tap selection value. This latter value is chosen to select a tap value which would produce the desired overall circuit delay if each delay element had an actual delay equal to its nominal delay. The computation circuit performs computations to determine which tap to select to correct for variations in the delay elements from their nominal delays.

Figure 3:
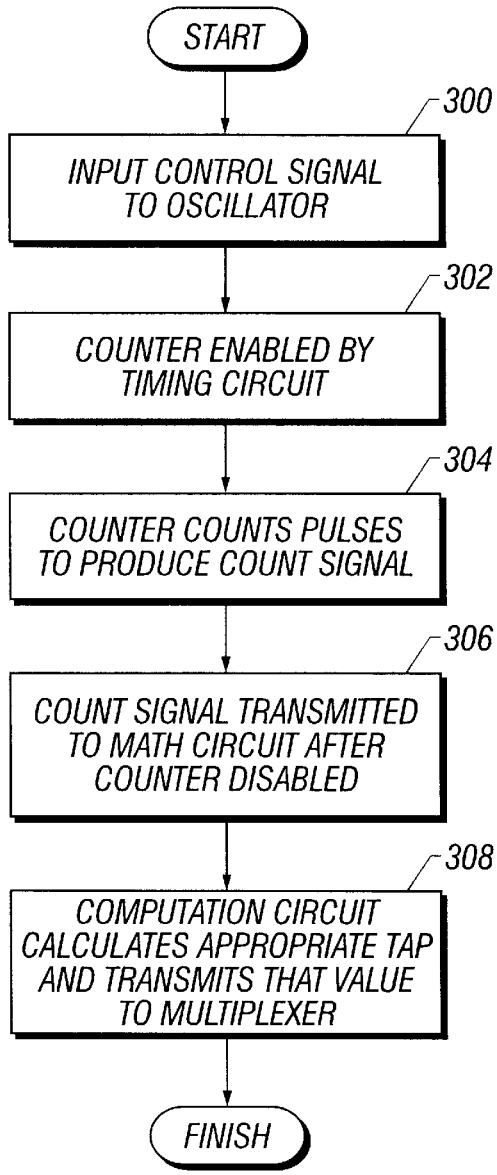
FIG. 3 is a flow chart showing the series of steps followed by the selection circuit when recalibrating the delay circuit.

FIG. 3 shows a series of steps followed by the selection circuit 28 when recalibrating the delay circuit 10. As shown in step 300, a control input signal is injected into the ring oscillator input 37, which then generates a pulse train 32. At step 302, the counter 34 is enabled by the clock signal for the preselected time interval noted above. During this preselected time, the counter 34 counts the pulses and generates an output count representing the number of pulses counted by the counter 34. At the end of the preselected time interval, the counter 34 is disabled and the output count 38 is transferred to the computation circuit 36, as indicated in step 306. In step 308, the computation circuit responsively calculates a value which will control multiplexer 20 to select the appropriate circuit tap 26.

Figure 4:
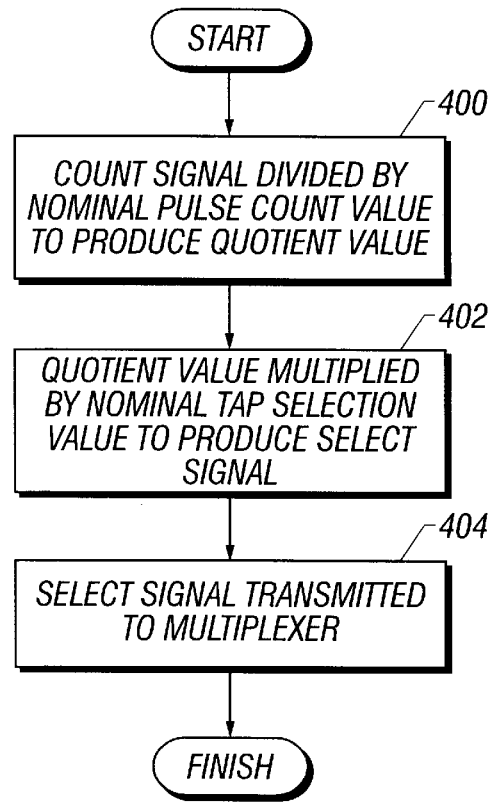
FIG. 4 is a flow chart showing the series of steps followed by the computation circuit in calculating the proper circuit tap.

FIG. 4 shows the series of steps followed by the computation circuit 36 in calculating the multiplexer control signal to select the proper circuit tap 26. After receiving the count signal 38 from the counter 34, the count signal 38 is divided by a "nominal pulse count value" to produce a quotient value (step 400). The nominal pulse count value is a value which is received from an external source and stored in a first register in the computation circuit 36. It represents the number of pulses that would be produced by the ring oscillator 30 while the counter 34 is enabled if the delay elements in the ring oscillator had actual delay times equal to their nominal delay times.

At step 402, the quotient value is multiplied by a "nominal tap selection value" to produce the select signal 40. The nominal tap selection value is a value received from an external source and stored a second register in the computation circuit 36. This latter value represents a tap that would produce the desired overall delay through the circuit 10 if the actual delay time of each of the delay elements 24 equaled its nominal delay time.

At step 404, the select signal 40 is transmitted to the multiplexer 20, thus causing the multiplexer 20 to select a new circuit tap 26 for transmission of the delayed version of the input signal to the multiplexer output 28.

In an alternative embodiment, the nominal delay time of the delay circuit 10 may be changed to another value. For example, a delay circuit 10 having a nominal delay time of sixteen nanoseconds can be changed to produce a nominal delay time of eighteen nanoseconds. In this embodiment, the computation circuit 36 includes a third register that is programmed, during manufacture, with a zero value. After producing the quotient value at step 400, the computation circuit 36 adds the contents of the second register and the third register to produce an alternative nominal tap selection value. This alternative nominal tap selection value is then used in step 404 to produce the select signal 40. In the event that a new nominal delay time is desired, the contents of the third register may be reprogrammed, by conventional means, to include a different value.

In accordance with the previous example, (assuming that the delay line 22 includes thirty-two gate pairs, each with a one nanosecond nominal delay time, and thirty-two equally spaced circuit taps 26), the numbers sixteen and zero are initially stored in the second and third registers, respectively, to produce the sixteen nanosecond delay time. The nominal delay time through this delay circuit 10 therefore may be reprogrammed, by conventional means, to be eighteen nanoseconds by reprogramming the third register to store the number two.

The ring oscillator 30 may be comprised of any known hardware and/or software in the art to effectuate the desired purposes, but it is important that the delay elements used to construct the oscillator have substantially the same operational characteristics as the delay elements 24. In this manner, the frequency of the ring oscillator output will be an accurate representation of the actual delay through the elements 24. The oscillator delay elements should have the same temperature and voltage characteristics so that changes in the environment affect all delay elements in the same manner.

In the preferred embodiment, the ring oscillator 30 includes a second delay line 31 having an input 37, a plurality of serially connected delay elements 24, and an output port connected to the input port. The second delay line 31 comprises the same type of delay elements 24 as the first delay line 22 to ensure accurate recalibration. For example, if the first delay line 22 is designed from a plurality of pairs of invertors with a nominal delay time of one nanosecond, the second delay line 31 should also be designed from a plurality of pairs of invertors with a nominal delay time of one nanosecond. It is not necessary for the number of delay elements 24 to be identical, however, since the expected pulse count is calculated in view of the number of delay elements 24 in the second delay line 31 In fact, it is preferable for the second delay line 31 to be made from fewer delay elements 24 than the first delay line 22 to save space on the integrated circuit chip 19. Because the ring oscillator 30 and delay circuits 10 are fabricated on the same integrated circuit chip 19 and are subjected to the same operating temperature and supply voltage, their respective delay characteristics should remain substantially identical with changing temperature and supply voltage. The output frequency of the ring oscillator 30 thus provides a representative measure of the actual delay through each delay element in the first delay line 22.

The counter 34 and computation circuit 36 also may be fabricated from conventional hardware and/or software. In the preferred embodiment, the counter 34 is fabricated from conventional flip-flop registers, while the computation circuit 36 is fabricated from conventional shift registers and flip-flop registers.

In another example of the delay circuit 10, the delay circuit 10 has an operating voltage of approximately 4.5–5.5 volts, an operating temperature of about 0–40 degrees Celsius, and a nominal delay time of sixteen nanoseconds. The delay line 22 includes 32 pairs of inverters, where each pair has a nominal delay time of 1 nanosecond. 32 circuit taps 26 connect between each pair of inverters and the 32 input ports of the multiplexer 20, which has a six bit selection port. The counter 34 is enabled for a period of time such that 128 pulses are expected to be counted by the counter 34 (i.e. produced by the ring oscillator 30). As such, a nominal pulse count value of 128 is stored in the first register of the computation circuit 36. Values of 16 and zero are respectively stored in the second and third registers of the computation circuit 36. The sum of these two values is the nominal delay tap value.

During an initial calibration of the circuit, assume that the counter 34 counted 128 pulses from the ring oscillator 30. Accordingly, the quotient value ($^{128}/_{128}$) is one and the tap selection value (16*1) is sixteen. This causes the sixteenth tap to be selected, thereby producing the desired delay of sixteen nanoseconds through the delay circuit 10. Assume that the circuit first recalibrates thirty seconds later. During this time, current through the delay circuit 10 may have increased, thus increasing the operating temperature. This increase in operating temperature may have decreased the actual propagation delay by a factor of two through the delay elements 24. During recalibration, the counter 34 thus counts 256 pulses (i.e. a decrease in the propagation delay time by a factor of two). Accordingly, the quotient value ($^{256}/_{128}$) is two and the tap selection value (16*2) is thirty-two This causes the thirty-second tap to be selected, thereby producing the desired propagation delay of sixteen nanoseconds.

The numbers used in each of the preceding examples are for demonstration purposes only and are not intended to limit the scope of the invention.

The non-tunable delay circuit 10 is less costly to manufacture and implement since it is entirely self-contained on a single integrated circuit chip 19. In addition, the automatic recalibration feature makes the delay circuit 10 relatively insensitive to operating conditions that could affect the delay time of a signal through the delay circuit 10.

It should be understood that the foregoing description of the invention is intended merely to be illustrative thereof and that other modifications, embodiments, and advantages of the invention may be apparent to those skilled in the art without departing from its spirit.

What is claimed is:

1. Apparatus for delaying an input signal for a predetermined time interval, the input signal transmitted upon a bus connected between two transmission mediums, the apparatus comprising:

a tapped delay line having a plurality of delay elements and connected in series, and a plurality of circuit taps between selected delay line delay elements to produce replicas of the input signal delayed by different time intervals;

a multiplexer having a single output for generating a delayed signal and a plurality of inputs, each of the plurality of inputs being connected to one of the plurality of circuit taps;

an oscillator constructed from oscillator delay elements for generating a train of pulses which is indicative of the actual delay through the delay line;

a selection circuit responsive to the train of pulses generated by the oscillator, the selection circuit having a counter responsive to the train of pulses for generating a count equal to the number of pulses within a predetermined time interval and a computation circuit responsive to the count for providing a selection signal to the multiplexer to connect one of the plurality of multiplexer inputs to the multiplexer output, the computation circuit comprising a memory for storing a nominal delay value and a nominal pulse count value, means for dividing the count by the nominal pulse count value to produce a quotient value, and means for multiplying the quotient value by the nominal delay value to produce the select signal.

2. The delay apparatus as defined by claim 1, wherein each of the delay line delay elements has a fixed delay interval.

3. The delay apparatus as defined by claim 1, wherein the delay line elements are substantially identical to each other.

4. The delay apparatus as defined by claim 1 wherein the oscillator delay elements are substantially identical to the delay line delay elements.

5. The delay apparatus as defined by claim 4 wherein each of the oscillator delay elements has a fixed delay interval.

6. The delay apparatus as defined by claim 1 wherein the oscillator oscillates at a frequency determined solely by the oscillator delay elements.

7. The delay apparatus as defined by claim 1, wherein all of the delay line delay elements and oscillator delay elements comprise integrated circuits on the same integrated circuit chip.

8. Apparatus for delaying an input signal for a predetermined time interval indicated by a nominal delay value, the apparatus comprising:

a tapped delay line having a plurality of delay elements each having a fixed delay interval and connected in series, and a plurality of circuit taps between selected delay elements to produce replicas of the input signal delayed by different time intervals;

a multiplexer having a single output for generating a delayed signal and a plurality of inputs, each of the plurality of inputs being connected to one of the plurality of circuit taps;

an oscillator constructed from delay elements identical to the delay line delay elements for generating a train of pulses which is indicative of the actual delay through the delay line; and a selection circuit responsive to the train of pulses generated by the oscillator and to the nominal delay value, the selection circuit having a counter responsive to the train of pulses for generating a count equal to the number of pulses within a predetermined time interval and a computation circuit responsive to the count for providing a selection signal to the multiplexer to connect one of the plurality of multiplexer inputs to the multiplexer output, the computation circuit comprising a memory for storing the nominal delay value and a nominal pulse count value, means for dividing the count by the nominal pulse count value to produce a quotient value, and means for multiplying the quotient value by the nominal delay value to produce the select signal.

9. The delay apparatus as defined by claim 8, wherein the delay line, the multiplexer, the oscillator and the selection circuit are all formed on a single integrated circuit.

10. The delay apparatus as defined by claim 8, wherein the computation circuit further comprises:

memory for storing a second nominal delay value; and means for adding the first nominal delay value and the second nominal delay value.

11. The delay apparatus as defined by claim 8, wherein the delay line comprises a plurality of serially connected inverters.

12. A method for delaying an input signal for a predetermined time interval, the method comprising the steps of:

A. inserting the input signal into a tapped delay line having a plurality of delay elements and connected in series, and a plurality of circuit taps between selected delay elements to produce replicas of the input signal delayed by different time intervals;

B. connecting each of the circuit taps to a multiplexer having a single output for generating a delayed signal and a plurality of inputs, each of the plurality of inputs being connected to one of the plurality of circuit taps;

C. generating a train of pulses with an oscillator constructed from delay elements having operating characteristics substantially equivalent to the delay elements;

D. counting the train of pulses with a counter to form a count equal to the number of pulses within a predetermined time interval;

E. storing a nominal delay value and a nominal pulse count value at a memory;

F. dividing the count equal to the number of pulses by the nominal pulse count value to produce a quotient value;

G. multiplying the quotient value by the nominal delay value to produce a select signal; and H. using the select signal for controlling the multiplexer to connect one of the plurality of multiplexer inputs to the output.

13. The method as defined in claim 12 wherein step C comprises the step of:

C1. generating a train of pulses with an oscillator constructed from delay elements which are substantially identical to the delay line delay elements.

14. The method as defined by claim 13 wherein step C1 comprises the step of:

C1a. generating a train of pulses with an oscillator constructed from delay elements having fixed delay intervals.

15. The method as defined by claim 12 wherein step C comprises the step of:

C2. generating a train of pulses with an oscillator which oscillates at a frequency determined solely by the oscillator delay elements.

* * * * *